(12) United States Patent
Lee et al.

(10) Patent No.: US 11,084,265 B2
(45) Date of Patent: Aug. 10, 2021

(54) MANUFACTURING SYSTEM FOR LAMINATED FILM AND MANUFACTURING METHOD FOR LAMINATED FILM

(71) Applicant: LG CHEM, LTD., Seoul (KR)

(72) Inventors: Beom Seok Lee, Daejeon (KR); Hang Suk Choi, Daejeon (KR); Jae Hoon Choi, Daejeon (KR); Eung Jin Jang, Daejeon (KR); Suk Jae Lee, Daejeon (KR); Ju Young Jeoung, Daejeon (KR); Kyu Sung Hwang, Daejeon (KR); Sung Kyum Kim, Daejeon (KR)

(73) Assignee: SHANJIN OPTOELECTRONICS (SUZHOU) CO., LTD., Jiangsu (CN)

( * ) Notice: Subject to any disclaimer, the term of this patent is extended or adjusted under 35 U.S.C. 154(b) by 0 days.

(21) Appl. No.: 16/342,419

(22) PCT Filed: Oct. 19, 2017

(86) PCT No.: PCT/KR2017/011581
§ 371 (c)(1),
(2) Date: Apr. 16, 2019

(87) PCT Pub. No.: WO2018/084469
PCT Pub. Date: May 11, 2018

(65) Prior Publication Data
US 2019/0248125 A1 Aug. 15, 2019

(30) Foreign Application Priority Data

Nov. 4, 2016 (KR) .................. 10-2016-0146882

(51) Int. Cl.
*B32B 37/10* (2006.01)
*H01L 51/00* (2006.01)
(Continued)

(52) U.S. Cl.
CPC ...... *B32B 37/1027* (2013.01); *B32B 37/0015* (2013.01); *B32B 37/0053* (2013.01);
(Continued)

(58) Field of Classification Search
CPC ............ B32B 37/1027; B32B 37/0015; B32B 37/0053; B32B 37/10; G02B 5/3033;
(Continued)

(56) References Cited

U.S. PATENT DOCUMENTS

| 4,069,081 A * | 1/1978 | Drower ............... B32B 37/0053 |
| | | 156/273.3 |
| 2012/0270054 A1 | 10/2012 | Hong et al. |
| 2015/0162408 A1 | 6/2015 | Hong et al. |

FOREIGN PATENT DOCUMENTS

| CN | 103842864 A | 6/2014 |
| JP | 2003011225 A * | 1/2003 |

(Continued)

OTHER PUBLICATIONS

Translation of JP-2003011225-A (Year: 2003).*
Translation of JP-2006213035-A (Year: 2006).*

*Primary Examiner* — Daniel McNally
(74) *Attorney, Agent, or Firm* — Dentons Us LLP (57) ABSTRACT

A system for manufacturing a laminated film, in which a first film and a second film are sequentially laminated, and the system includes: a film supplying part which supplies the first film and the second film; a bonding part which includes a first roll and a second roll that rotate in opposite directions, and compresses the first film and the second film supplied from the film supplying part and bonds the first film and the second film as the laminated film; and a bending inducing part which supports and bends the laminated film bonded and output from the bonding part, in which the second roll shifts in a direction along a circumference of a virtual circle (Continued)

having a larger radius than a radius of the first roll to control the bending of the laminated film.

8 Claims, 9 Drawing Sheets

(51) Int. Cl.
*H01L 27/32* (2006.01)
*G02F 1/1333* (2006.01)
*B32B 37/00* (2006.01)
*G02F 1/1335* (2006.01)
*G02B 5/30* (2006.01)
*B32B 38/18* (2006.01)

(52) U.S. Cl.
CPC .......... *B32B 37/10* (2013.01); *B32B 38/1825* (2013.01); *G02B 5/3033* (2013.01); *G02F 1/133305* (2013.01); *G02F 1/133528* (2013.01); *H01L 27/3244* (2013.01); *H01L 51/0097* (2013.01); *B32B 2307/42* (2013.01)

(58) Field of Classification Search
CPC ......... G02F 1/133305; G02F 1/133528; H01L 27/3244; H01L 51/0097
See application file for complete search history.

(56) References Cited

FOREIGN PATENT DOCUMENTS

| | | | |
|---|---|---|---|
| JP | 2003011225 A | | 1/2003 |
| JP | 2003181939 A | | 7/2003 |
| JP | 2006213035 A | * | 8/2006 |
| JP | 2006213035 A | | 8/2006 |
| JP | 2007062321 A | | 3/2007 |
| JP | 2007-98749 A | | 4/2007 |
| JP | 5734170 B2 | | 6/2015 |
| JP | 2018-511144 A | | 4/2018 |
| KR | 1020110079532 A | | 7/2011 |
| KR | 1020140040461 A | | 4/2014 |
| KR | 1020150133177 A | | 11/2015 |

\* cited by examiner

MANUFACTURING SYSTEM FOR LAMINATED FILM AND MANUFACTURING METHOD FOR LAMINATED FILM

This application is a national stage entry pursuant to 35 U.S.C. § 371 of International Application No. PCT/KR2017/011581 filed Oct. 19, 2017, which claims the benefits of the filing date of Korean Patent Application No. KR10-2016-0146882 filed with the Korean Intellectual Property Office on Nov. 4, 2016 the entire contents of which are incorporate herein by reference.

TECHNICAL FIELD

The present invention relates to a system and a method of manufacturing a laminated film, and more particularly, to a system and a method of manufacturing a laminated film, which induce bending of a laminated film during a process of manufacturing the laminated film.

BACKGROUND ART

Display units including a liquid crystal display (LCD), an organic light emitting diode (OLED), a plasma display panel (PDP), and an electrophoretic display (EPD) are manufactured through various processes. In order to manufacture the display unit, a polarizing film formed with an absorption axis is attached to one surface and the other surface of a panel, and when the absorption axis of the polarizing film attached to one surface of the panel is vertical to the absorption axis of the polarizing film attached to the other surface of the panel, the panel is normally operated.

The polarizing film used for manufacturing the display unit is formed by bonding a plurality of unit films having an optical characteristic. The polarizing film may be bent due to bending generated in the unit film itself having the optical characteristic or during a process of bonding the unit films as the polarizing film. However, when irregular bending is generated in the polarizing film, the display unit, which is manufactured by bonding the polarizing film having the irregular bending to the panel, may have a defect. Accordingly, in order to decrease a defect and improve a quality of the display unit, a method of controlling irregular bending generable in the polarizing film is demanded.

Further, in order to improve bonding preciseness and a bonding quality of the polarizing film with respect to the panel, a polarizing film, in which a curl is induced in a predetermined direction, may be used. Accordingly, in order to improve bonding preciseness and the like of the polarizing film with respect to the panel by inducing the polarizing film to have a curl in a predetermined direction, a method of inducing the polarizing film to be bent is demanded.

DETAILED DESCRIPTION OF THE INVENTION

Technical Problem

The present invention is conceived to solve the foregoing problems, and an object of the present invention is to provide a system and a method of manufacturing a laminated film, which makes a laminated film be bent in a desired direction during a process of manufacturing the laminated film.

Technical Solution

According to an exemplary embodiment of the present invention, there is provided a system for manufacturing a laminated film, in which a first film and a second film are sequentially laminated, the system including: a film supplying part which supplies the first film and the second film; a bonding part which includes a first roll and a second roll that rotate in opposite directions, and compresses the first film and the second film supplied from the film supplying part and bonds the first film and the second film as the laminated film; and a bending inducing part which supports the laminated film bonded and output from the bonding part and induces the laminated film to be bent, in which the second roll shifts in a predetermined direction along a circumference of a virtual circle having a larger radius than a radius of the first roll and controls the bending induced to the laminated film bonded by the first roll and the second roll.

According to the exemplary embodiment of the present invention, the virtual circle may be divided into two regions by a virtual vertical line passing through a rotation center of the first roll, and the second roll may be shifted in one of the two regions, which is adjacent to the film supplying part.

The bending inducing part according to the exemplary embodiment of the present invention may be vertically shifted with respect to a virtual horizontal line passing through a roll nip that is a space between the first roll and the second roll.

According to the exemplary embodiment of the present invention, a rotation center of the second roll may be located within a range of a<R1, in which a is shortest distance between a virtual vertical line and R1 is a diameter of the first roll.

The system for manufacturing the laminated film according to the exemplary embodiment of the present invention may further include a third roll which is disposed while being spaced apart from the second roll in a direction adjacent to the bending inducing part along the circumference of the virtual circle.

According to another exemplary embodiment of the present invention, there is provided a method of manufacturing a laminated film, in which a first film and a second film are sequentially laminated, the method including: supplying the first film and the second film; and compressing the first film and the second film and bonding the first film and the second film as the laminated film by a bonding part including a first roll and a second roll that rotate in opposite directions, in which the second roll shifts in a predetermined direction along a circumference of a virtual circle having a larger radius than a radius of the first roll and controls the bending induced to the laminated film bonded by the first roll and the second roll.

According to another exemplary embodiment of the present invention, the virtual circle may be divided into two regions by a virtual vertical line passing through a rotation center of the first roll, and the second roll may be shifted in one of the two regions, which is adjacent to the film supplying part.

According to another exemplary embodiment of the present invention, a bending inducing part may vertically shift with respect to a virtual horizontal line passing through a roll nip that is a space between the first roll and the second roll.

According to another exemplary embodiment of the present invention, a rotation center of the second roll may be located within a range of a<R1, in which a is shortest distance between a virtual vertical line and R1 is a diameter of the first roll.

Advantageous Effects

According to the exemplary embodiments of the present invention, it is possible to effectively control the vending induced to the laminated film and improve preciseness and a quality of the bonding of the first film and the second film during the process of inducing the laminated film to be bent by shifting the second roll in a predetermined direction along a circumference of a virtual circle having a larger radius than a radius of the first roll and adjusting a position of the second roll with respect to the first roll.

BEST MODE

Hereinafter, exemplary embodiments of the present invention will be described in detail with reference to the accompanying drawings so that those skilled in the art can easily carry out the present invention. However, the present invention may be modified in various different forms, and is not limited to the exemplary embodiments described herein. A part irrelevant to the description will be omitted in the drawings to clearly describe the present invention, and the similar elements will be designated by the similar reference numerals throughout the specification.

Terms used in the present specification will be briefly described, and the present invention will be described in detail.

As the terms used in the present invention, general terms, which are currently and widely used in consideration of a function in the present invention, have been selected as possible as it can, but the terms used in the present invention may be changed according to intentions of those skilled in the art or precedents, appearance of new technology, or the like. Further, in a specific case, there is a term randomly selected by an applicant, and in this case, a meaning of the term will be described in detail in the corresponding description of the invention. Accordingly, the terms used in the present invention shall be defined based on the meaning of the term and the contents throughout the present invention, not the simple name of the term.

In contrast, unless explicitly described to the contrary, when it is said that a specific part "comprises/includes" a specific constituent element, this means that another constituent element may be further "included/comprised", not that another constituent element is excluded.

Hereinafter, the present invention will be described in detail with reference to the accompanying drawings.

According to the exemplary embodiment of the present invention, there is provided a system for manufacturing a laminated film, which manufactures a laminated film F3 including sequentially laminated first film F1 and second film F2, the system including: a film supplying part 100 which supplies the first film F1 and the second film F2; a bonding part which includes a first roll 210 and a second roll 220 which rotate in opposite directions, and compresses the first film F1 and the second film F2 supplied from the film supplying unit part 100 to bond the first film F1 and the second film F2 as the laminated film F3; and a bending inducing part 300 which supports the laminated film F3 bonded and output from the bonding part and induces the laminated film F3 to be bent, in which the second roll 220 shifts in a predetermined direction along a circumference of a virtual circle having a larger radius than that of the first roll 210 to control the bending induced to the laminated film F3 bonded by the first roll 210 and the second roll 220.

According to the exemplary embodiment of the present invention, a position of the second roll 220 with respect to the first roll 210 is adjusted by shifting the second roll 220 in the predetermined direction along the circumference of the virtual circle having the larger radius than that of the first roll 210, thereby effectively controlling the bending induced to the laminated film F3 and improve preciseness and a quality of the bonding of the first film F1 and the second film F2 during the process of inducing the laminated film F3 to be bent.

At least one of the first film F1 and the second film F2 according to the exemplary embodiment of the present invention may be a multi-layered film in which a plurality of films is laminated. Accordingly, the laminated film F3 according to the exemplary embodiment of the present invention may have a structure, in which two or more films are laminated.

According to the exemplary embodiment of the present invention, a film having an optical characteristic is used as at least one of the first film F1 and the second film F2, thereby manufacturing the laminated film F3 having the optical characteristic. For example, a polarizing film may be manufactured by using a polarizer as the first film F1 and a polarizer protecting film as the second film F2. Further, an optical film may be manufactured by using the manufactured polarizing film as the first film F1 and a film, such as a phase difference film, a visual compensation film, and a brightness improving film, having an optical characteristic, as the second film F2.

The film supplying part 100 according to the exemplary embodiment of the present invention may supply the first film F1 and the second film F2 to the bonding part while supporting the first film F1 and the second film F2. The film supplying part 100 may include various transferring means which is capable of transferring a film while supporting the film. For example, a conveyor belt or a transferring roller may be used as the film supplying part 100.

The bonding part according to the exemplary embodiment of the present invention includes the first roll 210 and the second roll 220 which rotates in opposite directions, and compresses the first film F1 and the second film F2 supplied from the film supplying part 100 and bond the first film F1 and the second film F2 as the laminated film F3. A bonding agent or an adhesive agent may be applied onto one surface of at least one film of the first film F1 and the second film F2 to bond the first film F1 and the second film F2 through the bonding agent or the adhesive agent.

A diameter of the first roll 210 may be identically to or different from a diameter of the second roll 220. However, in order to improve preciseness and a quality of the bonding of the first film F1 and the second film F2, a diameter of the second roll 220 may be smaller than a diameter of the first roll 210. For example, a diameter of the first roll 210 may be 50 to 80 mm, and a diameter of the second roll 220 may be 25 to 50 mm. However, the foregoing diameters of the rolls are simply illustrative, and are not limited.

The bending inducing part 300 supports the laminated film F3 bonded and output from the bonding part and induces the laminated film F3 to be bent. The bending inducing part 300 may shift in a vertical direction, and may induce the laminated film F3 bonded and output from the bonding part in a predetermined direction and support the laminated film F3, thereby inducing the laminated film F3 to be bent. For example, a transferring roller which is capable of transferring the laminated film F3 while supporting the laminated film F3 may be used as the bending inducing part 300, and the bending inducing part 300 may use a pair of transferring rollers.

Figure 1:
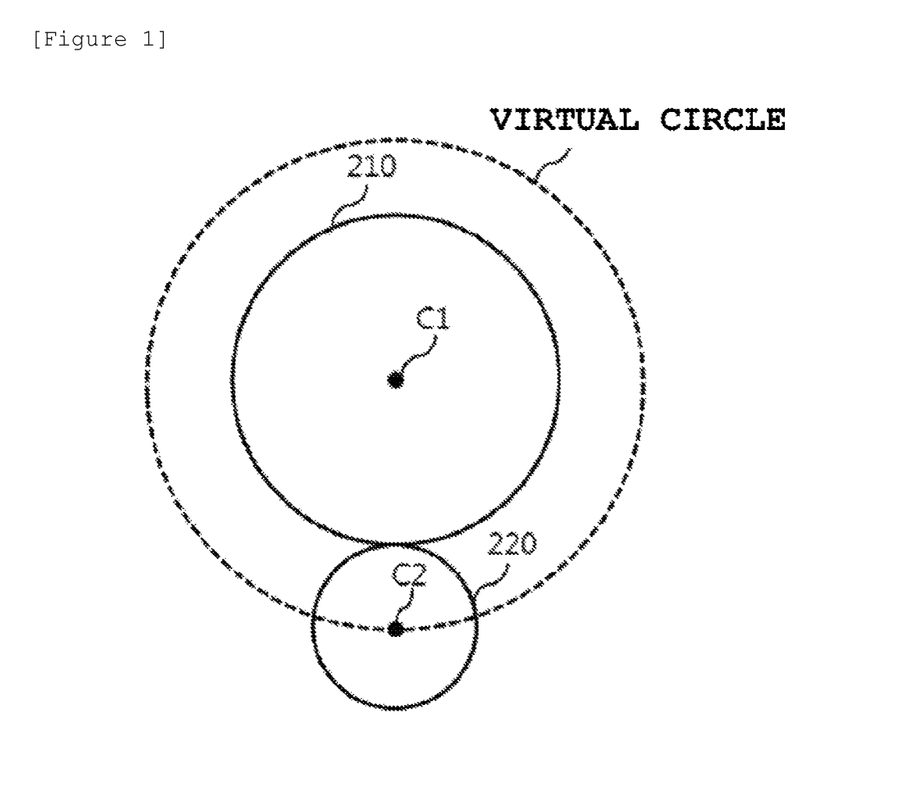
FIG. 1 is a diagram schematically illustrating the case where a second roll shifts in a predetermined direction along a circumference of a virtual circle having a larger radius than a radius of a first roll according to an exemplary embodiment of the present invention.

FIG. 1 is a diagram schematically illustrating the case where the second roll shifts in a predetermined direction along a circumference of a virtual circle having a larger radius than a radius of the first roll according to the exemplary embodiment of the present invention.

The second roll 220 according to the exemplary embodiment of the present invention shifts in a predetermined direction along a circumference of a virtual circle having a larger radius than a radius of the first roll 210, thereby controlling the bending induced to the laminated film F3 bonded by the first roll 210 and the second roll 220. Referring to FIG. 1, a rotation center C2 of the second roll 220 may be shifted along a path on a circumference of a virtual circle drawn based on a rotation center C1 of the first roll 210. A radius of the virtual circle is larger than a radius of the first roll 210, and may have a size in which the first film F1 and the second film F2 may be supplied between the first roll 210 and the second roll 220. Further, the second roll 220 may shift in a vertical direction and a horizontal direction. The bonding part may include, for example, a driving part which shifts the second roll 220, and a control unit which controls the driving part. The driving part may include a driving means which is capable of shifting the rotation center C2 of the second roll 220, and a publicly known configuration, such as a motor, which is capable of shifting the rotation center C2 of the second roll 220 may be used as the driving means. The control unit may shift the second roll 220 in the predetermined direction along the circumference of the virtual circle by controlling the driving means.

According to the exemplary embodiment of the present invention, during the process in which the laminated film F3 output by bonding the first film F1 and the second film F2 is transferred to the bending inducing part 300 and is supported, the laminated film F3 may be induced to be bent. The bending inducing part 300 shifts in an upper direction or a lower direction and induces the laminated film F3 bonded and output from the bonding part in the predetermined direction, thereby inducing the laminated film F3 to be bent in the predetermined direction. Further, according to the exemplary embodiment of the present invention, the bending induced to the laminated film F3 may be effectively controlled by adjusting a position of the second roll 220 with respect to the first roll 210. For example, the laminated film F3 bonded by the first roll 210 and the second roll 220 and output may be slightly bent by positioning the second roll 220 at a predetermined position by shifting the second roll 220 in the predetermined direction along the circumference of the virtual circle having the larger radius than the radius of the first roll 210. A direction of the first roll 210 supplied to the bonding part, a direction of the second roll 220 supplied to the bonding part, and a direction, in which the bonded laminated film 3 is output, may be adjusted by adjusting a position of the second roll 220. Accordingly, the laminated film F3 may be slightly bent by controlling an angle of the bonded and output laminated film F3 with respect to the first film F1 supplied to the bonding part, and an angle of the bonded and output laminated film F3 with respect to the second film F2 supplied to the bonding part.

That is, the laminated film F3 may be primarily induced to be bent during the process of bonding the first film F1 and the second film F2 as the laminated film F3, and the laminated film F3 may be secondarily induced to be bent during the process of transferring the laminated film F3 output from the bonding part to the bending inducing part 300 and supporting the laminated film F3.

Accordingly, according to the exemplary embodiment of the present invention, the laminated film F3 is induced to be slightly bent during the process of bonding the first film F1 and the second film F2 as the laminated film F3, so that the bending inducing part 300 may more easily induce the laminated film F3 to be bent.

Figure 2A:
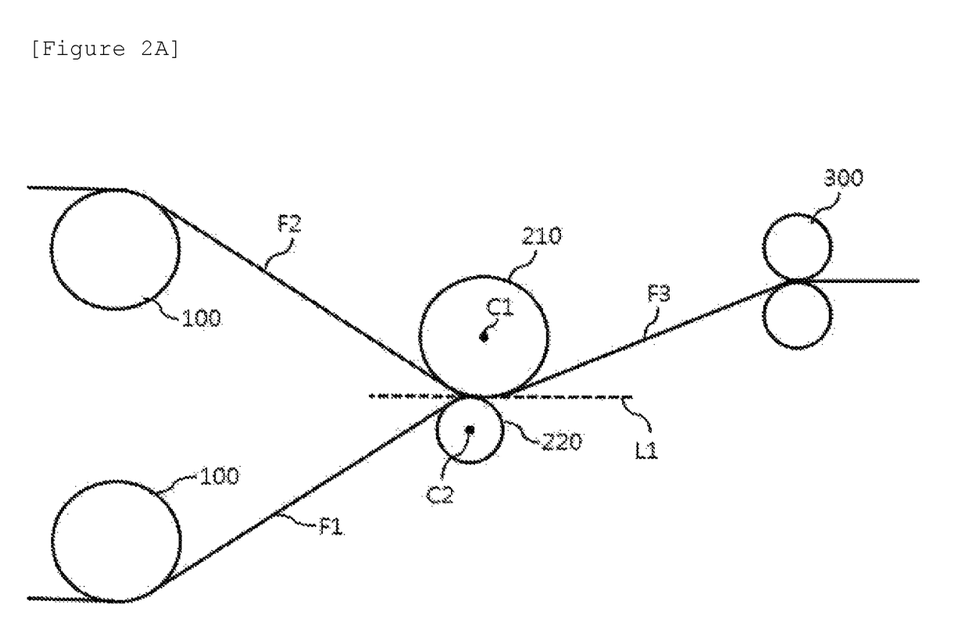
FIGS. 2A and 2B are diagrams schematically illustrating a system for manufacturing a laminated film, which induces a laminated film to be bent so that a first film is positioned at an external side by shifting positions of the second roll and a bending inducting part according to the exemplary embodiment of the present invention.
Figure 2B:
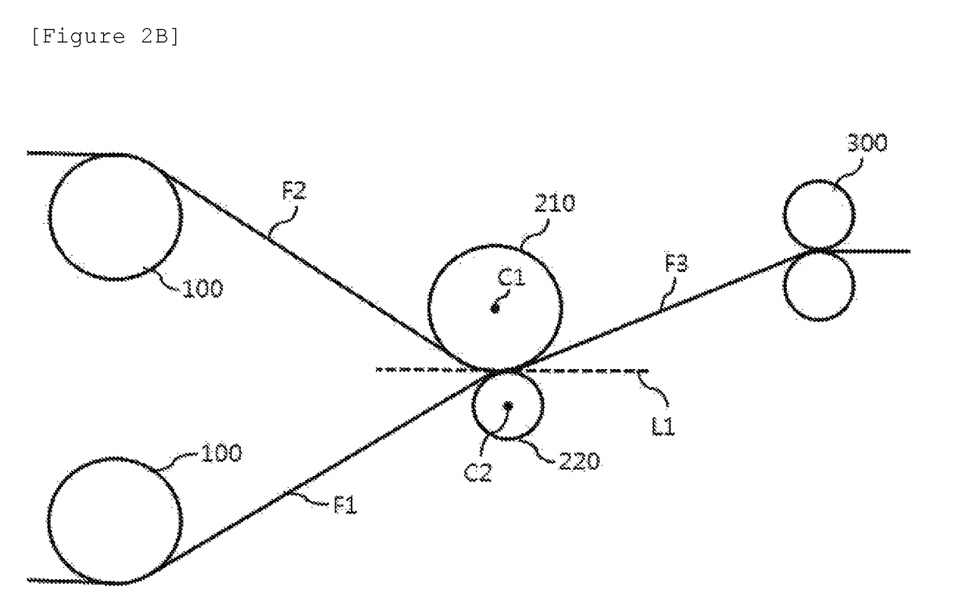
Figure 3A:
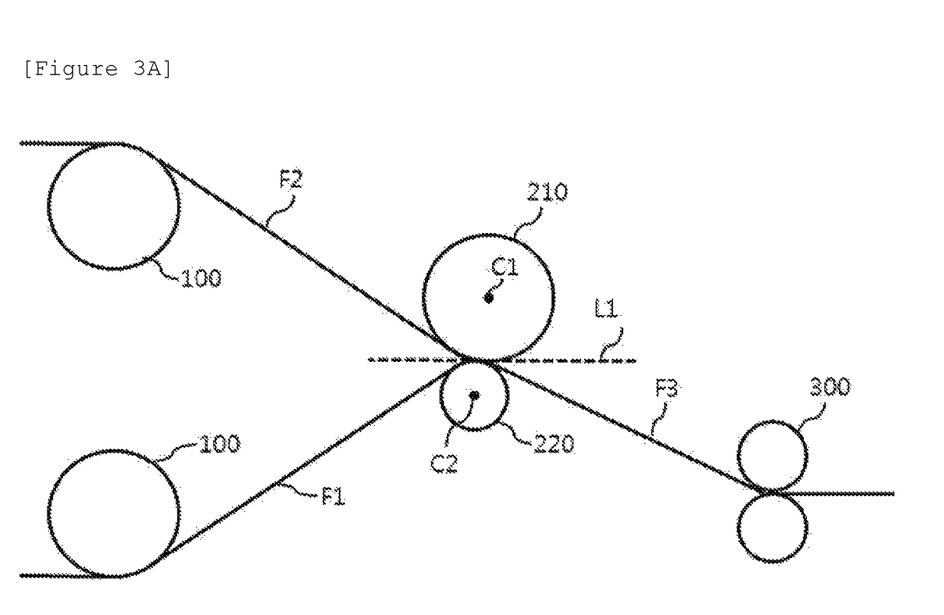
FIGS. 3A and 3B are diagrams schematically illustrating the system for manufacturing the laminated film, which induces the laminated film to be bent so that the first film is positioned at an internal side by shifting positions of the second roll and the bending inducting part according to the exemplary embodiment of the present invention.
Figure 3B:
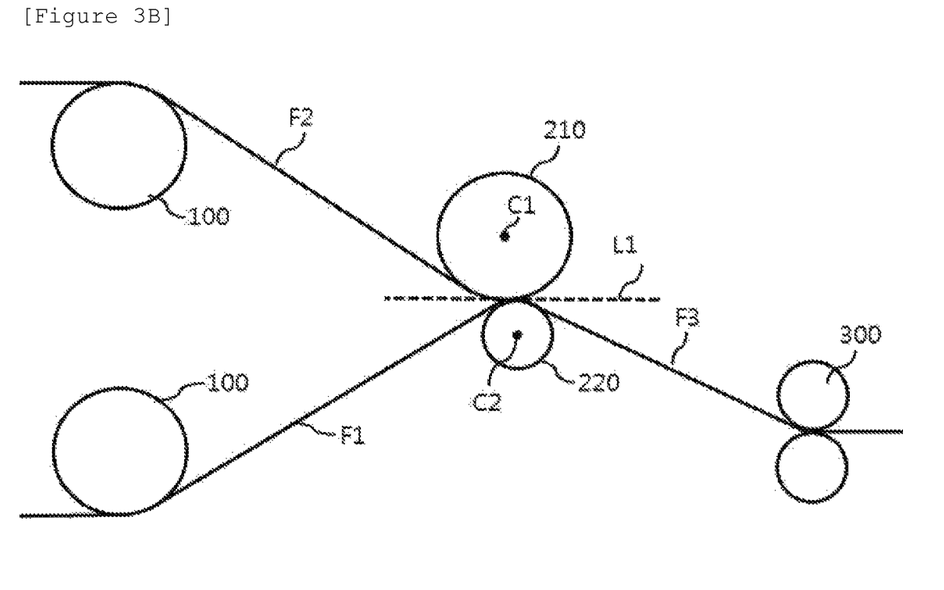
Figure 4A:
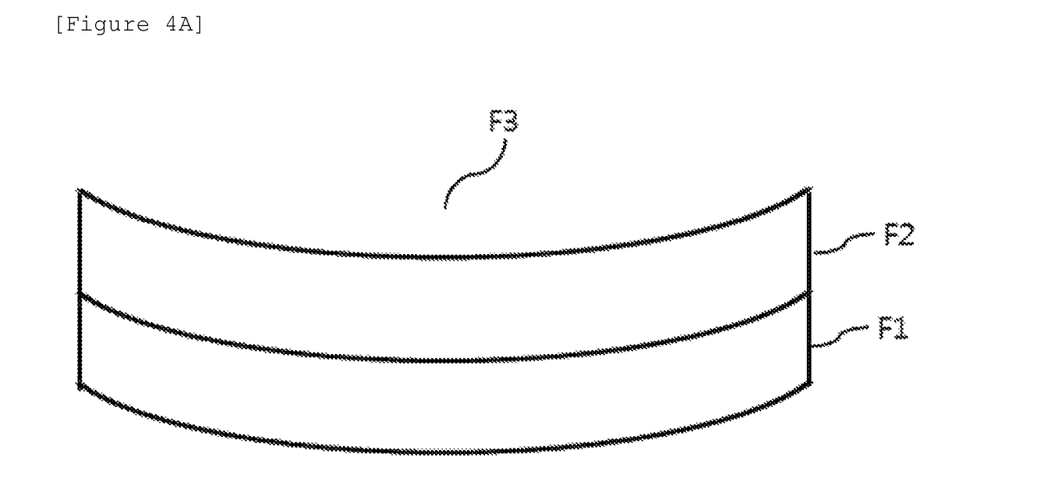
FIGS. 4A and 4B are diagrams illustrating the bending induced laminated film manufactured by the system for manufacturing the laminated film according to the exemplary embodiment of the present invention.
Figure 4B:
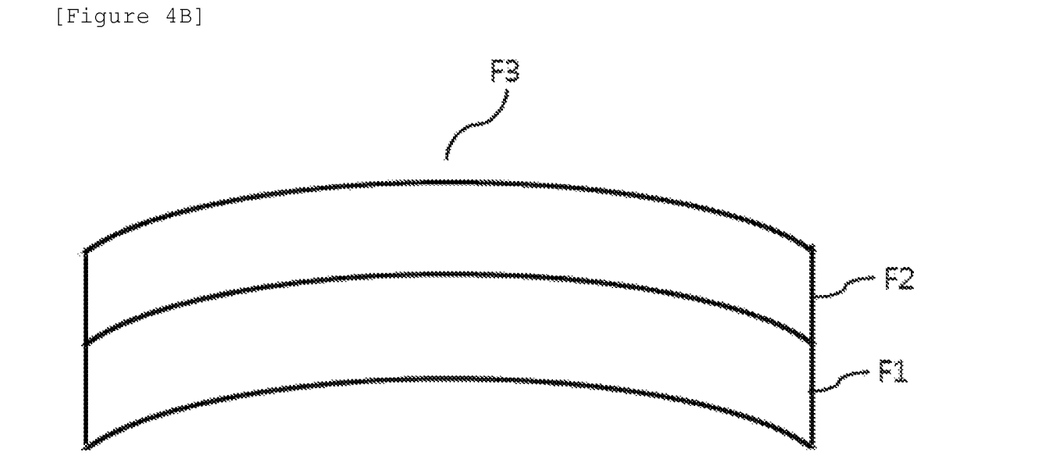

FIGS. 2A, 2B, 3A and 3B are diagrams schematically illustrating a system for manufacturing a laminated film, which induces a laminated film to be bent by shifting the positions of the second roll and the bent inducing part according to the exemplary embodiment of the present invention, and FIGS. 4A and 4B are diagrams illustrating the bending induced laminated film manufactured by the system for manufacturing the laminated film according to the exemplary embodiment of the present invention.

The bending inducing part 300 according to the exemplary embodiment of the present invention may vertically shift with respect to a virtual horizontal line L1 passing through a roll nip that is a space between the first roll 210 and the second roll 220.

FIGS. 2A and 2B are diagrams illustrating the case where the bending inducing part according to the exemplary embodiment of the present invention is positioned in an upper portion of the virtual horizontal line passing through the roll nip that is the space between the first roll and the second roll to induce the laminated film to be bent. Referring to FIGS. 2A and 2B, the bending inducing part 300 is positioned in an upper portion of the virtual horizontal line L1 passing through the roll nip that is the space having the shortest distance between an external circumferential surface of the first roll 210 and an external circumferential surface of the second roll 220, thereby inducing the laminated film F3 to be bent in a longitudinal direction of the laminated film F3.

The bending inducing part 300 and the second roll 220 according to the exemplary embodiment of the present invention are interlinked with each other and driven, thereby controlling a direction and the degree of bending induced to the laminated film F3. That is, the angle of the bonded and output laminated film F3 with respect to the first film F1 supplied to the bonding part, the angle of the bonded and output laminated film F3 with respect to the second film F2 supplied to the bonding part, and the direction of the laminated film F3 bonded and output from the bonding part are controlled by adjusting the relative positions of the bending inducing part 300 and the second roll 220, thereby controlling a direction and the degree of bending induced to the laminated film F3.

Referring to FIGS. 2A and 2B, the bending inducing part 300 is positioned in the upper portion of the virtual horizontal line L1 to transfer the laminated film F3 bonded and output from the bonding part in a direction inclined in the upper side and support the laminated film F3, thereby inducing the laminated film F3 to be bent. Further, when the bending inducing part is positioned in the upper portion of the virtual horizontal line, as illustrated in FIGS. 2A and 2B, the position of the second roll may be adjusted, thereby controlling the bending induced to the laminated film.

For example, as illustrated in FIG. 2A, when the bending inducing part is positioned in the upper portion of the virtual horizontal line and the second roll is shifted in a direction adjacent to the film supplying part and is positioned, the bending may be induced to the laminated film so that the first film is positioned at an internal side. As illustrated in FIG. 2B, when the bending inducing par tis positioned in the upper portion of the virtual horizontal line and the second roll is shifted in a direction adjacent to the bending inducing part and is positioned, the bending may be induced to the laminated film so that the first film is positioned at an external side. However, it is possible to manufacture the laminated film having a bending direction different from the foregoing bending direction by further adjusting the relative positions of the second roll and the bending inducing part.

FIGS. 3A and 3B are diagrams illustrating the case where the bending inducing part according to the exemplary embodiment of the present invention is positioned in a lower portion of the virtual horizontal line passing through the roll nip that is the space between the first roll and the second roll to induce the laminated film to be bent. The bending inducing part 300 according to the exemplary embodiment of the present invention may be positioned in the lower portion of the virtual horizontal line L1 and transfer the laminated film F3 bonded and output from the bonding part in a direction inclined in the lower side and support the laminated film F3, thereby inducing the laminated film F3 to be bent.

Further, referring to FIGS. 3A and 3B, when the bending inducing part 300 is positioned in the lower portion of the virtual horizontal line L1, the position of the second roll may be adjusted, thereby inducing the laminated film to be bent as illustrated in FIGS. 4A and 4B. That is, the bending in a direction and the degree desired by a user may be induced to the laminated film within a single laminated film system by adjusting the relative positions of the second roll and the bending inducing part.

Accordingly, according to the exemplary embodiment of the present invention, the bending, in which the first film F1 is positioned at the external side, may be induced to the laminated film in the longitudinal direction of the laminated film F3 as illustrated in FIG. 4A and the bending, in which the first film F1 is positioned at the internal side, may be induced to the laminated film in the longitudinal direction of the laminated film F3 as illustrated in FIG. 4B by controlling the positions of the second roll and the bending inducing part.

Figure 5A:
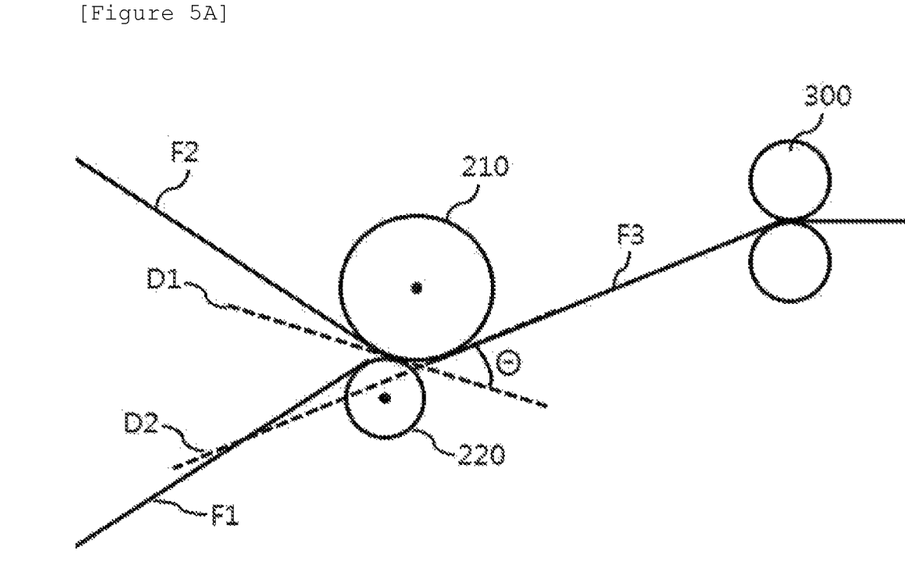
FIGS. 5A and 5B are diagrams illustrating an adjustment of an angle formed by a laminated film output from a bonding part and a laminated film transferred to the bending inducing part according to the adjustment of the position of the second roll according to the exemplary embodiment of the present invention.
Figure 5B:
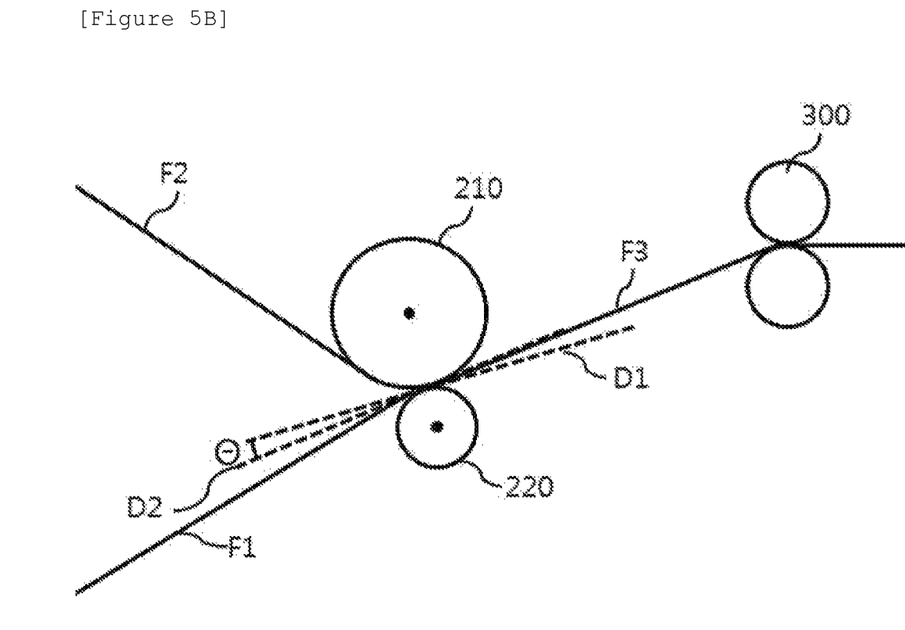

FIGS. 5A and 5B are diagrams illustrating an adjustment of an angle formed by a laminated film output from the bonding part and a laminated film transferred to the bending inducing part according to the adjustment of the position of the second roll according to the exemplary embodiment of the present invention.

The first film F1 and the second film F2 supplied to the bonding part are bonded as the laminated film F3 by the first roll 210 and the second roll 220. The first film F1 and the second film F2 are compressed and bonded as the laminated film F3 in the roll nip between the first roll 210 and the second roll 220, and a transfer direction of the bonded and output laminated film f3 is changed toward the bending inducing part 300 and the laminated film F3 is transferred. That is, a transfer path of the laminated film F3 is formed from an initial direction D1 of the laminated film F3 which is bonded and output from the bonding part in a change direction D2 that is a direction induced by the bending inducing part 300, and the laminated film F3 may be induced to be bent during the process of transferring the laminated film F3 to the bending inducing part 300.

Further, the degree of bending induced to the laminated film F3 may be controlled by adjusting an angle formed by the initial direction D1 and the change direction D2 in the transfer path of the laminated film F3. Referring to FIG. 5A, the initial direction D1 in the transfer path of the laminated film F3 may be parallel to a virtual surface that passes through a bonded surface of the first film F1 and the second film F2 by the first roll 210 and the second roll 220, and the change direction D2 may be parallel to the transfer direction of the laminated film F3 transferred to the bending inducing part 300. The degree of bending induced to the laminated film F3 may be easily controlled by adjusting the angle formed by the initial direction D1 and the change direction D2 by adjusting the position of the second roll 220 with respect to the first roll 210. For example, when the bending inducing part 300 is positioned in the upper portion of the virtual horizontal line L1 that passes through the roll nib between the first roll 210 and the second roll 220, the second roll 220 may be shifted so that the rotation center C2 of the second roll 220 is positioned at a side (hereinafter, a first side) of the film supplying part 100 or a second side opposite to the first side based on a virtual vertical line L2 passing through the rotation center C1 of the first roll 210. As illustrated in FIG. 5A, the degree of bending induced to the laminated film F3 may be increased by increasing the angle formed by the initial direction D1 and the change direction D2 by shifting the rotation center C2 of the second roll 220 toward the first side. In the meantime, as illustrated in FIG. 5B, the degree of bending induced to the laminated film F3 may be decreased by decreasing the angle formed by the initial direction D1 and the change direction D2 by shifting the rotation center C2 of the second roll 220 toward the second side.

Accordingly, according to the exemplary embodiment of the present invention, the degree of bending induced to the laminated film F3 may be easily controlled by adjusting the relative position of the second roll 220 with respect to the first roll 210.

Further, according to the exemplary embodiment of the present invention, the shift of the bending inducing part 300 may be minimized by adjusting the position of the second roll 220. The angle formed by the initial direction D1 and the change direction D2 may be effectively adjusted by adjusting the position of the second roll 220, thereby minimizing a shift distance of the bending inducing part 300 and considerably decreasing a height of equipment of the system for manufacturing the laminated film. For example, when the curl is induced to the laminated film F3 in the same direction with the same degree, a shift distance of the bending inducing part when the rotation center C2 of the second roll 220 is positioned in the virtual vertical line passing through the rotation center C1 of the first roll 210 is larger than a shift distance of the bending inducing part 300 when the position of the second roll 220 is adjusted. Accordingly, according to the exemplary embodiment of the present invention, the laminated film F3 may be induced to be bent in the state where the shift distance of the bending inducing part 300 is minimized.

Further, according to the exemplary embodiment of the present invention, a distance between the bonding part and the bending inducing part 300 may be adjusted. For example, the bending inducing part 300 may be shifted in a direction adjacent to the bonding part or in a direction opposite to the direction. A deformation of the film occurable during the process of transferring the laminated film F3 from the bonding part to the bending inducing part 300 may be suppressed by decreasing a reaching distance and a reaching time of the laminated film F3 bonded and output from the bonding part to the bending inducing part 300 by adjusting the distance between the bending inducing part 300 and the bonding part.

Figure 6:
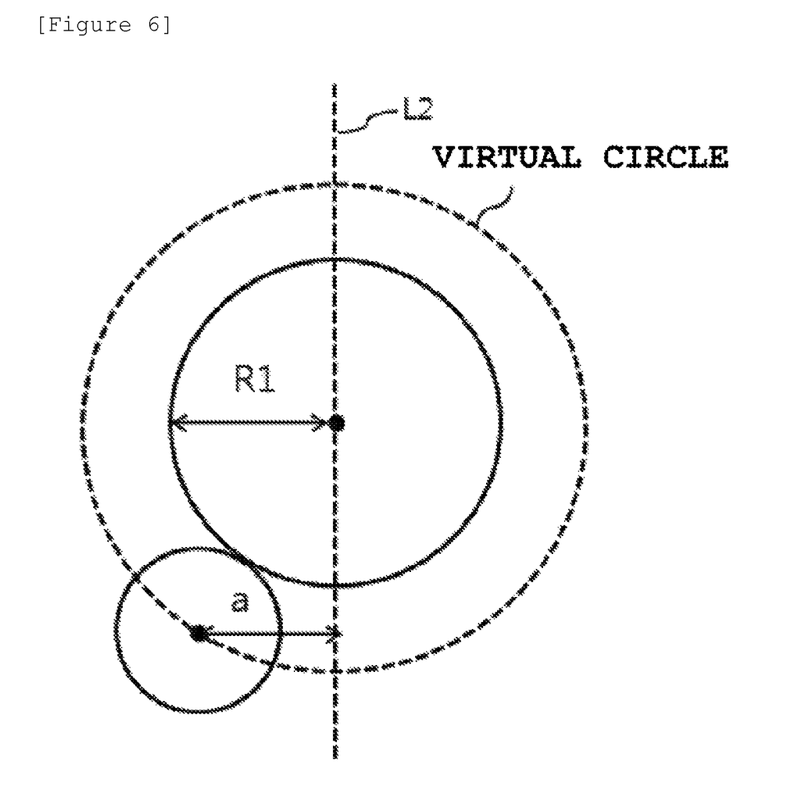
FIG. 6 is a diagram illustrating a distance between a rotation center of the second roll and a virtual vertical line passing through a rotation center of the first roll according to the exemplary embodiment of the present invention.

FIG. 6 is a diagram illustrating a distance between the rotation center of the second roll and the virtual vertical line passing through the rotation center of the first roll according to the exemplary embodiment of the present invention.

According to the exemplary embodiment of the present invention, when it is assumed that a diameter of the first roll 210 is R1 and a shortest distance between the virtual vertical line L2 passing through the rotation center C1 of the first roll 210 and the rotation center C2 of the second roll 220 is a, the rotation center C2 of the second roll 220 may be located within the range of a<R1. Referring to FIG. 6, the second roll 220 may be shifted to a predetermined position along a virtual circumference having a larger radius than the radius of the first roll 210, in such a manner that the rotation center C2 of the second roll 220 may be shifted so as to be present in the range of a<R1. When the rotation center C2 of the second roll 220 is present in the range of a<R1, preciseness of the bonding between the first film F1 and the second film F2 bonded by the first roll 210 and the second roll 220 is decreased, so that a quality of the bonding of the laminated film F3 may be degraded. Accordingly, in order to manufacture the laminated film F3 having an excellent bonding quality by improving the preciseness of the bonding of the first film F1 and the second film F2, the second roll 220 may be shifted so that the rotation center C2 of the second roll 220 is present in the range of a<R1.

Figure 7A:
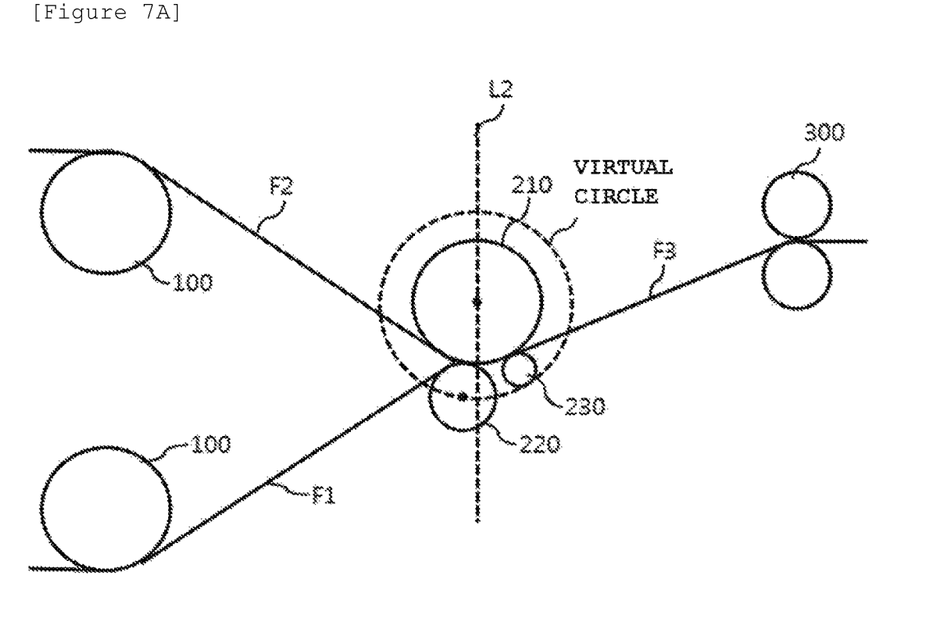
FIGS. 7A and 7B are diagrams illustrating the case where the second roll is positioned in a region that is adjacent to a film supplying part in a region of the virtual circle according to the exemplary embodiment of the present invention.
Figure 7B:
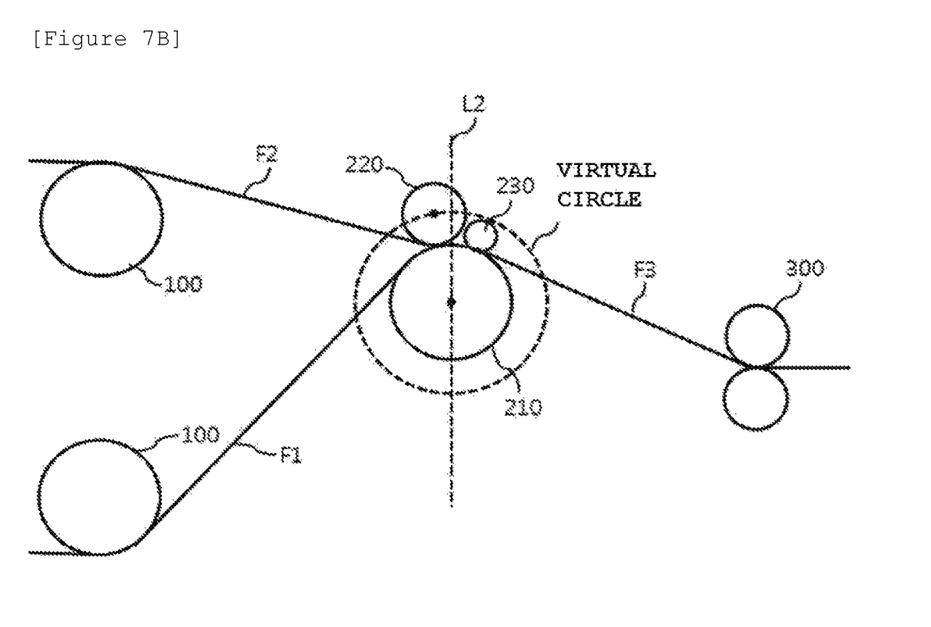

FIGS. 7A and 7B are diagrams illustrating the case where the second roll is positioned in a region that is adjacent to the film supplying part in a region of the virtual circle according to the exemplary embodiment of the present invention.

According to the exemplary embodiment of the present invention, the virtual circle is divided into two regions by the virtual vertical line L2 passing through the rotation center C1 of the first roll 210, and the second roll 220 may be shifted in the region adjacent to the film supplying part 100 in the region of the virtual circle. Referring to FIGS. 7A and 7B, the virtual circle having the larger radius than the radius of the first roll 210 may be divided into two regions based on the virtual vertical line L2 passing through the rotation center C1 of the first roll 210. The second roll 220 may be shifted in a region (hereinafter, a first region) adjacent to the film supplying part 100 between the two regions divided by the virtual vertical line L2. The second roll 220 is positioned in the first region, so that a bonding quality of the laminated film F3 bonded by the first roll 210 and the second roll 220 may be improved. For example, when the bending inducing part 300 is positioned in the upper portion of the virtual horizontal line L1 passing through the roll nip that is the space between the first roll 210 and the second roll 220 and the laminated film F3 is induced to be bent in which the first film F1 is positioned at the external side in the longitudinal direction of the laminated film F3, the second roll 220 may be positioned in the lower portion of the first roll 210 in the first region and bond the first film F1 and the second film F2 as the laminated film. Referring to FIG. 7A, the second roll 220 is positioned in the lower portion of the first roll 210 in the first region and thus a section of the first film F1 and the second film F2 that are bonded as the laminated film by the first roll 210 and the second roll 220 is increased, thereby increasing the degree of bonding of the second film F2 with respect to the first film F1. Further, when the bending inducing part 300 is positioned in the lower portion of the virtual horizontal line L1 passing through the roll nip that is the space between the first roll 210 and the second roll 220 and the laminated film F3 is induced to be bent in which the first film F1 is positioned at the internal side in the longitudinal direction of the laminated film F3, the second roll 220 may be positioned in the upper portion of the first roll 210 in the first region and bond the first film F1 and the second film F2 as the laminated film F3. Referring to FIG. 7B, the second roll 220 is positioned in the upper portion of the first roll 210 in the first region and thus a section of the first film F1 and the second film F2 that are bonded as the laminated film F3 by the first roll 210 and the second roll 220 is increased, thereby increasing the degree of bonding of the second film F2 with respect to the first film F1.

Accordingly, according to the exemplary embodiment of the present invention, it is possible to manufacture the laminated film F3 having an excellent bonding quality by improving the degree of bonding of the second film F2 with respect to the first film F1 by positioning the second roll 220 in the first region and increasing the bonded section of the first film F1 and the second film F2.

The system for manufacturing the laminated film according to the exemplary embodiment of the present invention may further include a third roll 230 which is disposed while being spaced apart from the second roll 220 in the direction adjacent to the bending inducing part 300 along the circumference of the virtual circle. Referring to FIGS. 7A and 7B, the third roll 230 is disposed while being spaced apart from the second roll 220 in the direction adjacent to the bending inducing part 300, thereby improving the degree of bonding of the second film F2 with respect to the first film F1. The number of third rolls 230 may be plural, and the third roll 230 may shift in the vertical direction and a horizontal direction, and a position of the third roll 230 may be adjusted according to the position of the second roll 220. That is, the third roll 230 may shift in linkage with the shift of the second roll 220. The third roll 230 is adjacently disposed to the second roll 220 and the section of the first film F1 and the second film F2 bonded as the laminated film F3 is increased, thereby improving the degree of bonding of the second film F2 with respect to the first film F1 and manufacturing the laminated film F3 having the excellent bonding quality.

According to another exemplary embodiment of the present invention, there is provided a method of manufacturing a laminated film, which manufactures a laminated film F3 including sequentially laminated first film F1 and second film F2, the method including: supplying the first film F1 and the second film F2; and compressing the first film F1 and the second film F2 and bonding the first film F1 and the second film F2 as the laminated film F3 by a bonding part including a first roll 210 and a second roll 220 which rotate in opposite directions, in which the second roll 220 shifts in a predetermined direction along a circumference of a virtual circle having a larger radius than a radius of the first roll 210 to control the bending induced to the laminated film F3 bonded by the first roll 210 and the second roll 220.

According to the method of manufacturing the laminated film according to another exemplary embodiment of the present invention, the bending induced to the laminated film may be effectively controlled by adjusting a position of the second roll with respect to the first roll.

According to another exemplary embodiment of the present invention, a bending inducing part may vertically shift with respect to a virtual horizontal line passing through a roll nip that is a space between the first roll and the second roll. The bending inducing part 300 and the second roll 220 may be driven while being interlinked with each other to control a direction and the degree of bending induced to the laminated film F3, so that the method of manufacturing the laminated film according to another exemplary embodiment of the present invention may simply and effectively induce the laminated film to be bent.

According to another exemplary embodiment of the present invention, the virtual circle may be divided into two regions by a virtual vertical line L2 passing through a rotation center C1 of the first roll 210, and the second roll 220 may shift in a region adjacent to a film supplying part 100 in the region of the virtual circle. The second roll 220 may be positioned in the region (hereinafter, the first region) adjacent to the film supplying part 100 between the two regions divided by the virtual vertical line L2, so that the laminated film F3 having an excellent bonding quality may be manufactured by increasing a section of the first film F1 and the second film F2 bonded by the first roll 210 and the second roll 220 as the laminated film F3.

According to another exemplary embodiment of the present invention, when it is assumed that a diameter of the first roll 210 is R1 and a shortest distance between the virtual vertical line L2 passing through the rotation center C1 of the first roll 210 and the rotation center C2 of the second roll 220 is a, the rotation center C2 of the second roll 220 may be located within the range of a<R1.

The present invention will be described in more detail through the Examples. The Examples are simply illustrative, and do not limit the present invention.

Figure 8:
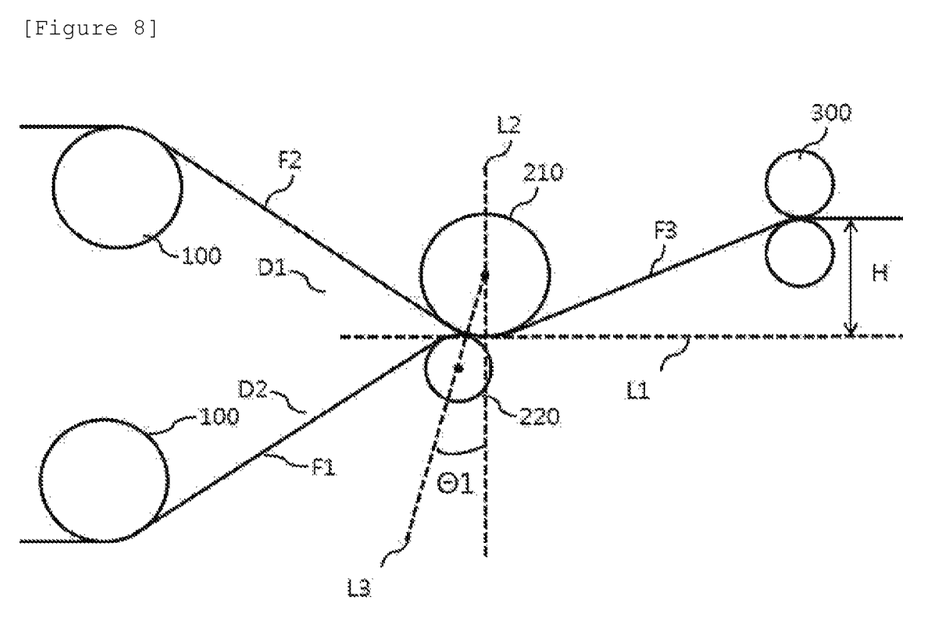
FIG. 8 is a diagram illustrating the system for manufacturing the laminated film used in Examples 1 to 6 according to the exemplary embodiment of the present invention.

FIG. 8 is a diagram illustrating the system for manufacturing the laminated film used in Examples 1 to 6 according to the exemplary embodiment of the present invention.

Examples 1 to 5

A PET film (LG Chem.) having a thickness of about 40 μm formed with an adhesive agent layer having a thickness of about 12 mμ was prepared as a first film F1, and a polarizing film (LG Chem.) having a thickness of about 200 μm and including a polarizer and a polarizer protecting film was prepared as a second film F2. A bonding part, in which a radius of the first roll is 25 mm and a radius of the second roll is 25 mm, was used, and a distance between the bonding part and the bending inducing part was set to 1,000 mm. Then, the bonding part and the bending inducing part 300 were set under the condition described in Table 1 below to manufacture a laminated film F3 induced to be bent.

Referring to FIG. 8, in Table 1 below, Θ1 represents an angle formed by a virtual vertical line L2 passing through a rotation center of the first roll 210 and a virtual line L3 passing through the rotation center of the first roll 210 and a rotation center of the second roll 220. A minus (−) value among the values of Θ1 is a value of the angle formed by the virtual vertical line L2 and the virtual line L3 when the rotation center of the second roll is positioned at a side of the film supplying part based on the virtual vertical line L2, and a plus (+) value is a value of the angle formed by the virtual vertical line L2 and the virtual line L3 when the rotation center of the second roll is positioned at a side of the bending inducing part based on the virtual vertical line L2.

Referring to FIG. 8, in Table 1 below, H represents a length between a virtual horizontal line L1 passing through the roll nip between the first roll 210 and the second roll 220 and a portion of the laminated film supported by the bending inducing part. A plus (+) value among the values of H is a value of a length when the bending inducing part is positioned at an upper portion of the virtual horizontal line L1, and a minus (−) value among the values of H is a value of a length when the bending inducing part is positioned at a lower portion of the virtual horizontal line L1.

TABLE 1

|  | Θ1 | H |
| --- | --- | --- |
| Example 1 | +90° | +500 mm |
|  |  | +250 mm |
|  |  | 0 mm |
|  |  | −250 mm |
|  |  | −500 mm |
| Example 2 | +45° | +500 mm |
|  |  | +250 mm |
|  |  | 0 mm |
|  |  | −250 mm |
|  |  | −500 mm |
| Example 3 | 0° | +500 mm |
|  |  | +250 mm |
|  |  | 0 mm |
|  |  | −250 mm |
|  |  | −500 mm |
| Example 4 | −45° | +500 mm |
|  |  | +250 mm |
|  |  | 0 mm |
|  |  | −250 mm |
|  |  | −500 mm |
| Example 5 | −90° | +500 mm |
|  |  | +250 mm |
|  |  | 0 mm |
|  |  | −250 mm |
|  |  | −500 mm |

Figure 9:
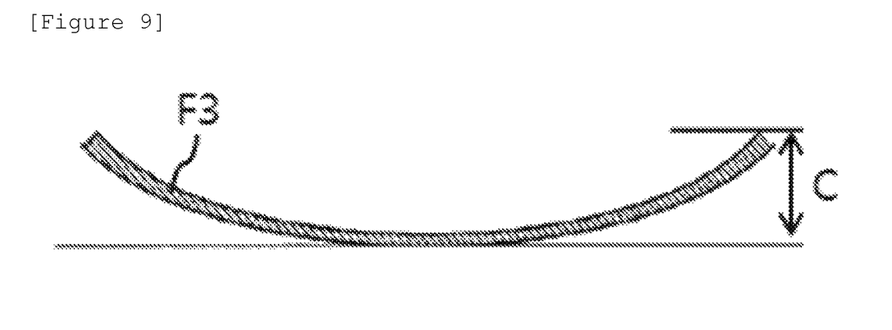
FIG. 9 is a diagram illustrating a specimen of the laminated film which is manufactured in Examples 1 to 6 of the present invention and is cut in a predetermined size.

FIG. 9 is a diagram illustrating a specimen of the laminated film which is manufactured in Examples 1 to 6 of the present invention and is cut in a predetermined size.

Measurement of Quantity of Bending Changed

Three specimens were prepared by cutting the laminated films manufactured in Examples 1 to 6 in a size of 25 cm in width and 25 cm in length, the specimen was laid on a flat bed so that the first film is positioned in a lower portion, and a height from the flat bed to a cross-section of the specimen was measured, and the result of the measurement is represented in Table 2 below.

Referring to FIG. 9, in Table 2 below, C represents a height from the flat bed to a cross-section of the specimen, a plus (+) value among the values of C is a value of a height of the specimen induced to be bent in which the first film is positioned at an internal side, and a minus (−) value among the values of C is a value of a height of the specimen induced to be bent in which the first film is positioned at an external side.

TABLE 2

|  | Value C of specimen 1 (mm) | Value C of specimen 2 (mm) | Value C of specimen 3 (mm) |
|---|---|---|---|
| Example 1 | +25 | +23 | +27 |
|  | −11 | −14 | −14 |
|  | −42 | −47 | −46 |
|  | −74 | −79 | −78 |
|  | −120 | −119 | −128 |
| Example 2 | +54 | +51 | +59 |
|  | +35 | +31 | +28 |
|  | +14 | +15 | +11 |
|  | −12 | −15 | −17 |
|  | −30 | −27 | −28 |
| Example 3 | +81 | +78 | +85 |
|  | +64 | +57 | +58 |
|  | +38 | +41 | +43 |
|  | +11 | +9 | +15 |
|  | −6 | −8 | −9 |
| Example 4 | +96 | +103 | +93 |
|  | +74 | +69 | +72 |
|  | +57 | +53 | +56 |
|  | +31 | +36 | +34 |
|  | +21 | +16 | +18 |
| Example 5 | +120 | +118 | +128 |
|  | +96 | +92 | +89 |
|  | +61 | +68 | +63 |
|  | +38 | +34 | +38 |
|  | +11 | +7 | +7 |

The above description of the present invention is illustrative, and those skilled in the art to which the present invention pertains may understand that the present invention may be easily modified to other particular forms without changing the technical spirit or the essential feature of the present invention. Thus, it is to be appreciated that the embodiments described above are intended to be illustrative in every sense, and not restrictive. For example, each constituent element described in a singular form may be distributed and carried out, and similarly, constituent elements described in a distributed form may be carried out in a combination form.

The scope of the present invention is represented by the claims to be described below rather than the detailed description, and it is to be interpreted that the meaning and scope of the claims and all the changes or modified forms derived from the equivalents thereto come within the scope of the present invention.

The invention claimed is:

1. A system for manufacturing a laminated film, in which a first film and a second film are sequentially laminated to form the laminated film, the system comprising:
a film supplying part which supplies the first film and the second film;
a bonding part which includes a first roll and a second roll that rotate in opposite directions, wherein the bonding part compresses the first film and the second film supplied by the film supplying part to bond the first film to the second film and form the laminated film;
a bending inducing part which supports and bends the laminated film output from the bonding part such that a portion of the laminated film supported by the bending inducing part is parallel to and spaced apart from a virtual horizontal line passing through a roll nip between the first roll and the second roll; and
a third roll positioned between the second roll and the bending inducing part and spaced apart from the second roll in a direction adjacent to the bending inducing part along a circumference of a virtual circle having a larger radius than a radius of the first roll,
wherein the second roll shifts in a direction along the circumference of the virtual circle to control the bending of the laminated film,
wherein a diameter of the second roll is smaller than a diameter of the first roll, and
wherein the third roll moves in a vertical direction and a horizontal direction in conjunction with a movement of the second roll along the circumference of the virtual circle.

2. The system of claim 1, wherein the virtual circle is divided into two regions by a virtual vertical line passing through a rotation center of the first roll, wherein one of the two regions is adjacent to the film supplying part and the second roll is shiftable in the one region adjacent to the film supplying part to control the bending of the laminated film.

3. The system of claim 1, wherein the bending inducing part is vertically shiftable with respect to a virtual horizontal line passing between the first roll and the second roll.

4. The system of claim 1, wherein a rotation center of the second roll is located within a range of a <R1, in which a is a shortest distance between a virtual vertical line passing through a rotation center of the first roll and a rotation center of the second roll and R1 is a diameter of the first roll.

5. A method of manufacturing a laminated film, in which a first film and a second film are sequentially laminated to form the laminated film, the method comprising:
supplying the first film and the second film;
bonding the first film and the second film by compressing the first film and the second film together by passing the first film and the second film through a bonding part to form the laminated film, wherein the bonding part comprises a first roll and a second roll rotating in opposite directions, and a third roll positioned between the second roll and a bending inducing part and spaced apart from the second roll in a direction adjacent to the bending inducing part along a circumference of a virtual circle having a larger radius than a radius of the first roll, and
controlling a bending of the laminated film by shifting the second roll in a direction along the circumference of the virtual circle such that a portion of the laminated film supported by the bending inducing part is parallel to and spaced apart from a virtual horizontal line passing through a roll nip between the first roll and the second roll,
wherein a diameter of the second roll is smaller than a diameter of the first roll, and
wherein the third roll moves in a vertical direction and a horizontal direction in conjunction with a movement of the second roll along the circumference of the virtual circle.

6. The method of claim 5, wherein the virtual circle is divided into two regions by a virtual vertical line passing through a rotation center of the first roll, wherein one of the two regions is adjacent to a film supplying part and the second roll is shiftable in the one region adjacent to the film supplying part.

7. The method of claim 5, wherein a bending inducing part is vertically shiftable with respect to a virtual horizontal line passing between the first roll and the second roll.

8. The method of claim 5, wherein a rotation center of the second roll is located within a range of a <R1, in which a is a shortest distance between a virtual vertical line passing through a rotation center of the first roll and a rotation center of the second roll and R1 is a diameter of the first roll.

* * * * *